(12) United States Patent
Huang et al.

(10) Patent No.: US 11,127,697 B2
(45) Date of Patent: Sep. 21, 2021

(54) SEMICONDUCTOR DEVICE AND METHOD OF MANUFACTURING THE SAME

(71) Applicant: Advanced Semiconductor Engineering, Inc., Kaohsiung (TW)

(72) Inventors: Wen Hung Huang, Kaohsiung (TW); Yan Wen Chung, Kaohsiung (TW); Wei Chu Sun, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/508,219

(22) Filed: Jul. 10, 2019

(65) Prior Publication Data

US 2021/0013163 A1    Jan. 14, 2021

(51) Int. Cl.
*H01L 23/48* (2006.01)
*H01L 29/40* (2006.01)
*H01L 23/66* (2006.01)
*H01L 23/498* (2006.01)
*H01L 23/00* (2006.01)

(52) U.S. Cl.
CPC ........ *H01L 23/66* (2013.01); *H01L 23/49822* (2013.01); *H01L 23/562* (2013.01); *H01L 2223/6616* (2013.01); *H01L 2223/6677* (2013.01)

(58) Field of Classification Search
CPC ....... H01L 2224/94; H01L 2224/13147; H01L 2224/16145; H01L 23/49827; H01L 23/5226; H01L 2225/06541; H01L 23/5389; H01L 21/486; H01L 23/147; H01L 23/49822; H01L 23/5386; H01L 23/522; H01L 23/528; H01L 23/5329; H01L 23/5385; H01L 23/562; H01L 23/53295; H01L 2223/54486; H01L 2223/6616; H01L 2223/6677
USPC ....................................................... 257/774
See application file for complete search history.

(56) References Cited

U.S. PATENT DOCUMENTS

| | | | | |
|---|---|---|---|---|
| 2013/0284506 | A1* | 10/2013 | Zanma | H05K 1/185 174/260 |
| 2015/0040389 | A1* | 2/2015 | Ishiguro | H05K 1/185 29/832 |
| 2019/0220123 | A1* | 7/2019 | Kanaya | G06F 3/0443 |

* cited by examiner

*Primary Examiner* — Theresa T Doan
(74) *Attorney, Agent, or Firm* — Foley & Lardner LLP

(57) ABSTRACT

A semiconductor device and a method of manufacturing the same are provided. The semiconductor device includes an antenna zone and a routing zone. The routing zone is disposed on the antenna zone, where the antenna zone includes a first insulation layer and two or more second insulation layer and a thickness of the first insulation layer is different from that of the second insulation layer.

20 Claims, 9 Drawing Sheets

SEMICONDUCTOR DEVICE AND METHOD OF MANUFACTURING THE SAME

BACKGROUND

1. Technical Field

The present disclosure relates to a semiconductor device and a method of manufacturing the same, and, more particularly, to a semiconductor device including an antenna zone.

2. Description of the Related Art

There is a continuing demand to reduce dimensions of semiconductor devices. Miniaturization has had a severe impact on the design of a semiconductor device; in particular, on a wireless communication device, such as an RF (radio frequency) module. As an RF module is developing towards high-frequency applications (such as 5G applications), the antenna zone thereof should be thicker so that it can have sufficient power to transmit within a certain distance. Nevertheless, a thicker antenna zone cannot satisfy the miniaturization demand.

In addition, miniaturization also has had a severe impact on the assembly stresses generated during production of a semiconductor device; in particular, when the semiconductor device includes multiple metal interconnection structures. Such stresses may cause warpage of the semiconductor device or even detachment of a chip die thereof, resulting in a poor electrical connection between the chip die and the metal interconnection structures.

Therefore, it would be desirable to provide a semiconductor device with an improved antenna structure to reduce the assembly stresses generated thereof and prevent a poor electrical connection between the chip and the metal interconnection structures without compromising the miniaturization and high frequency demands.

SUMMARY

In an aspect, a semiconductor device includes an antenna zone and a routing zone. The routing zone is disposed on the antenna zone, where the antenna zone comprises a first insulation layer and two or more second insulation layers and a thickness of the first insulation layer is different from that of the second insulation layer.

In an aspect, a semiconductor device includes an antenna zone and a RF routing zone. The RF routing zone is disposed on the antenna zone, where the routing zone includes one or more first insulation layer and a second insulation layer and a thickness of the first insulation layer is different from that of the second insulation layer.

In an aspect, a method of manufacturing a semiconductor device includes: providing a first antenna layer, the antenna layer having a first surface and a second surface opposite to the first surface; disposing a second antenna layer adjacent to the second surface of the antenna layer, wherein the second antenna layer comprises one or more second conductive via; and disposing a first insulation layer disposed adjacent to the first surface of the first antenna layer and opposite to the second antenna layer, wherein the first insulation layer comprises one or more first conductive via, wherein the first conductive via substantially matches the second conductive via in shape through the first antenna layer.

BRIEF DESCRIPTION OF THE DRAWINGS

FIG. 7A, FIG. 7B, FIG. 7C, and FIG. 7D illustrate a method for manufacturing a semiconductor device such as the semiconductor device of FIG. 2.

DETAILED DESCRIPTION

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

The present disclosure provides for an improved semiconductor device with improved antenna structure that can reduce warpage of the semiconductor device and can satisfy miniaturization and high frequency demands.

Figure 1:
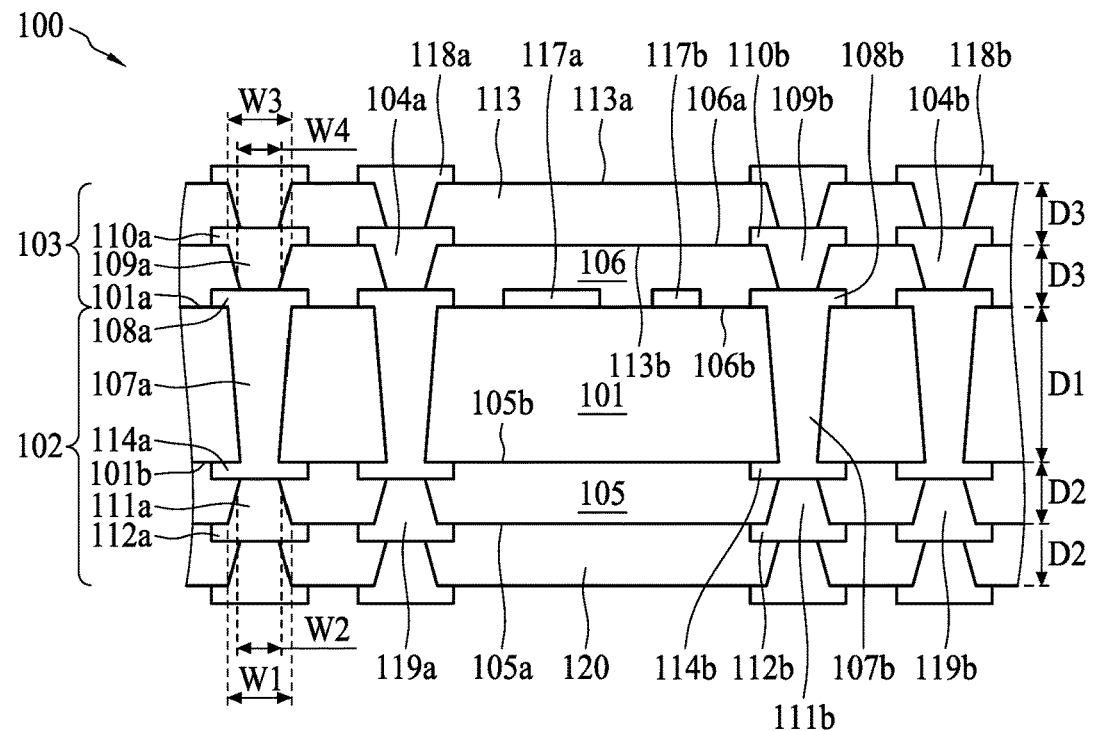
FIG. 1 illustrates a cross-sectional view of a semiconductor device according to an embodiment of the present disclosure.

FIG. 1 illustrates a cross-sectional view of a semiconductor device 100 according to an embodiment of the present disclosure. The semiconductor device 100 of FIG. 1 includes an antenna zone 102 and a routing zone 103.

The antenna zone 102 may be applied to a semiconductor device that may be operated at a high frequency. In some embodiments, the antenna zone 102 may be applied to a semiconductor device that may be operated at a frequency in the range of about 2 GHz to about 300 GHz, about 5 GHz to about 300 GHz, about 10 GHz to about 300 GHz, about 15 GHz to about 300 GHz, about 20 GHz to about 300 GHz, about 25 GHz to about 300 GHz, about 30 GHz to about 300 GHz, about 35 GHz to about 300 GHz, about 40 GHz to about 300 GHz, or about 45 GHz to about 300 GHz.

The antenna zone 102 includes a first insulation layer 101 and two or more second insulation layer 105, 120. The thickness and material of the first insulation layer 101 and the second insulation layer 105, 120 are determined depending on the desired function or property of the antenna zone 102. For example, if the antenna zone 102 is designed to be operated at a high frequency such as to be operated in the range of 30 GHz to 300 GHz, in order to reduce the transmission loss and to transmit for a long distance, the antenna zone 102 should be thicker and/or include materials with low dielectric constant and dielectric loss. Nevertheless, as the antenna zone 102 becomes thicker, it would become more costly and more difficult to process, such as when disposing a through hole therein or disposing a circuit thereon, which involves highly precise control and costly equipment. Moreover, the miniaturization demand may not be satisfied.

Therefore, in some embodiments, the first insulation layer 101 may have a thickness D1 of about 180 µm to about 600 about 190 µm to about 600 about 200 µm to about 600 about 210 µm to about 600 about 220 µm to about 600 about 230 µm to about 600 about 240 µm to about 600 about 250 µm to about 600 about 260 µm to about 600 about 270 µm to about 600 about 280 µm to about 600 about 290 µm to about 600 about 300 µm to about 600 about 310 µm to about 600 about 320 µm to about 600 about 330 µm to about 600 about 340 µm to about 600 about 350 µm to about 600 about 360 µm to about 600 about 370 µm to about 600 about 380 µm to about 600 about 390 µm to about 600 or about 400 µm to about 600 µm.

By forming the first insulation layer 101 with a thickness D1 within a specific range, the semiconductor device warpage can be reduced because a thicker insulation layer can provide more strength to reduce the stress caused by the comparative structural arrangement for an antenna, such as the comparative insulation layer and via arrangement, where the insulation layers have similar thickness and the vias are formed in the same direction.

The first insulation layer 101 has a first surface 101a and a second surface 101b opposite to the first surface 101a.

The first insulation layer 101 includes one or more first conductive via 107a, 107b. The first conductive via 107a, 107b may be formed by mechanical drilling or by laser drilling. In some embodiments, the first conductive via 107a, 107b is a through hole formed by mechanical drilling and extending from the first surface 101a of the first insulation layer 101 to the second surface 101b of the first insulation layer 101 so that an electrical signal may be transmitted from one side of the first insulation layer 101 to the other side of the first insulation layer 101. Alternatively, the first conductive via 107a, 107b extends from the first surface 101a of the first insulation layer 101 but ends before reaching the second surface 101b of the first insulation layer 101.

One or more first connecting element 108a, 108b may be disposed adjacent to the first surface 101a of the first insulation layer 101. In some embodiments, the first connecting element 108a, 108b electrically connects to the first conductive via 107a, 107b, respectively. The first connecting element 108a, 108b may be a bonding bond and/or trace. A bonding pad may be, for example, a contact pad of a trace. The first connecting element 108a, 108b may include, for example, one of, or a combination of, copper, gold, indium, tin, silver, palladium, osmium, iridium, ruthenium, titanium, magnesium, aluminum, cobalt, nickel, or zinc, or other metals or metal alloys.

One or more second connecting element 114a, 114b may be disposed adjacent to the second surface 101b of the first insulation layer 101. In some embodiments, the second connecting element 114a, 114b electrically connects to the first conductive via 107a, 107b, respectively. The second connecting element 114a, 114b may be a bonding bond and/or trace. A bonding pad may be, for example, a contact pad of a trace. The second connecting element 114a, 114b may include, for example, one of, or a combination of, copper, gold, indium, tin, silver, palladium, osmium, iridium, ruthenium, titanium, magnesium, aluminum, cobalt, nickel, or zinc, or other metals or metal alloys.

One or more bonding bond and/or trace and one or more overlying interconnection structures therein 117a, 117b may be disposed on the first surface 101a of the first insulation layer 101. The bonding bond and/or trace 117a, 117b may be a part of a circuit.

The first insulation layer 101 may include an insulation material or other suitable material that has low dielectric constant and/or low dielectric loss as a base material. In some embodiments, the first insulation layer 101 includes polypropylene.

The second insulation layer 105 is disposed adjacent to the second surface 101b of the first insulation layer 101. The second insulation layer 105 has a second top surface 105a, a second bottom surface 105b opposite to the second top surface 105a, and a second thickness D2. As shown in the embodiment of FIG. 1, the second insulation layer 105 is disposed above the second surface 101b of the first insulation layer 101.

The thickness D1 of the first insulation layer 101 is different from the thickness D2 of the second insulation layer 105. In some embodiments, the thickness D1 of the first insulation layer 101 is greater than the thickness D2 of the second insulation layer 105. By designing the first insulation layer 101 as having a thickness D1 greater than the thickness D2 of the second insulation layer 105 (or another insulation layer disposed above the second insulation layer 105), the warpage of a semiconductor device caused by a comparative antenna configuration can be eased because a thicker insulation layer can provide more strength to reduce the stress caused by the comparative antenna structural arrangement, such as the comparative insulation layer and via arrangement as described above. In some embodiments, the thickness D2 of the second insulation layer 105 may be in the range of about 70 µm to about 200 about 75 µm to about 195 about 80 µm to about 190 about 85 µm to about 185 about 90 µm to about 180 about 95 µm to about 175 about 100 µm to about 170 about 105 µm to about 165 about 110 µm to about 160 about 115 µm to about 155 about 120 µm to about 145 or about 125 µm to about 140 µm.

The second insulation layer 105 defines one or more opening 119a, 119b. Each opening 119a, 119b corresponds to a respective second conductive via 111a, 111b. The opening 119a, 119b has a first width W1 close to the opening and a second width W2 close to the bottom. In some embodiments, the opening 119a, 119b inclines inwardly from the opening to the bottom. Therefore, the opening 119a, 119b has a first width W1 greater than a second width W2. Accordingly, the respective second conductive via 111a, 111b formed therein will also have a first width W1 greater than a second width W2 (e.g., the respective second conductive via 111a, 111b is formed by a shape inclining inwardly from the opening to the bottom). In some embodiments, the second conductive via 111a, 111b electrically connects to the second connecting element 114a, 114b.

One or more third connecting element 112a, 112b may be disposed adjacent to the second top surface 105a of the second insulation layer 105. In some embodiments, the third connecting element 112a, 112b electrically connects to the second conductive via 111a, 111b. The third connecting element 112a, 112b may be a bonding bond and/or trace. A bonding pad may be, for example, a contact pad of a trace. The third connecting element 112a, 112b may include, for example, one of, or a combination of, copper, gold, indium, tin, silver, palladium, osmium, iridium, ruthenium, titanium, magnesium, aluminum, cobalt, nickel, or zinc, or other metals or metal alloys.

The second insulation layer 105 may include an insulation material or other suitable material that has low dielectric constant and/or low dielectric loss as a base material. In some embodiments, the second insulation layer 105 includes polypropylene.

The antenna zone 102 may include at least one first insulation layer 101 and at least one second insulation layer 105. In some embodiments, a number of the first insulation layers 101 and a number of the second insulation layers 105 are stacked together. In some embodiments, the first insulation layers 101 and the second insulation layers 105 are stacked in an alternative manner. In some embodiments, two or more first insulation layers 101 are stacked with single second insulation layer 105 in an alternative manner. In some embodiments, two or more second insulation layers 105 are stacked with single first insulation layer 101 in an alternative manner.

The routing zone 103 is disposed on the antenna zone 102. The routing zone 103 may be a RF routing zone. The routing zone 103 includes two or more third insulation layer 106, 113. In some embodiments, the third insulation layer 106, 113 is disposed adjacent the first insulation layer 101 and distant from the second insulation layer 105. The third insulation layer 106, 113 has a third top surface 106a, 113a, a third bottom surface 106b, 113b opposite to the third top surface 106a, 113b, respectively, and a third thickness D3.

The thickness D3 of the third insulation layer 106, 113 is different from the thickness D1 of the first insulation layer 101. In some embodiments, the thickness D3 of the third insulation layer 106, 113 is smaller than thickness D1 of the first insulation layer 101. By designing the third insulation layer 106, 113 as having a thickness D3 smaller than the thickness D1 of the first insulation layer 101, the warpage of a semiconductor device caused by a comparative antenna configuration can be eased because a thicker insulation layer is provided and a thicker insulation layer can provide more strength compared to a thinner one.

The thickness D3 of the third insulation layer 106, 113 may be substantially the same or different from the thickness D2 of the second insulation layer 105. In some embodiments, the thickness D3 of the third insulation layer 106, 113 is substantially the same with the thickness D2 of the second insulation layer 105. By forming the third insulation layer 106, 113 with a thickness D3 substantially equal to or corresponding to the thickness D2 of the second insulation layer 105, the third insulation layer 106 may substantially match the second insulation layer 105 through the first insulation layer 101 in thickness. Therefore, the semiconductor device warpage can be further eased because the antenna exhibits a more symmetry structure than a comparative one, which can reduce the stress caused by an asymmetry structure. In some embodiments, the thickness D3 of the third insulation layer 106, 113 may be in the range of about 70 μm to about 200 about 75 μm to about 195 about 80 μm to about 190 about 85 μm to about 185 about 90 μm to about 180 about 95 μm to about 175 about 100 μm to about 170 about 105 μm to about 165 of about 110 μm to about 160 about 115 μm to about 155 about 120 μm to about 145 or about 125 μm to about 140 μm.

The third insulation layer 106 defines one or more openings 104a, 104b. Each opening 104a, 104b corresponds to a respective third conductive via 109a, 109b. The opening 104a, 104b, is defined by a shape and/or position substantially matching the opening 119a, 119b in the second insulation layer 105 through the first insulation layer 101 so that the third conductive via 109a, 109b formed in the opening 104a, 104b can substantially match the second conductive via 111a, 111b in shape and/or position through the first insulation layer 101. The opening 104a, 104b has a third width W3 close to the opening and a fourth width W4 close to the bottom. In some embodiments, the opening 104a, 104bb inclines inwardly from the opening to the bottom. Therefore, the opening 104a, 104b has a third width W3 greater than a fourth width W4. Accordingly, the respective third conductive via 109a, 109b will also have a third width W3 greater than a fourth width W4 (e.g., the respective third conductive via 109a, 109b is formed by a shape inclining inwardly from the opening to the bottom). In some embodiments, the third conductive via 109a, 109b electrically connects to the first connecting element 108a, 108b.

The third conductive via 109a, 109b may substantially match the second conductive via 111a, 111b in shape through the first insulation layer 101 (e.g., they both incline from outside to inside or incline inwardly from the opening to the bottom). The third conductive via 109a, 109b may also substantially match the second conductive via 111a, 111b in position through the first insulation layer 101. Unlike the comparative design of conductive vias which are all formed to incline from the same direction, this configuration of the third conductive via 109a, 109b and the second conductive via 111a, 111b of the present disclosure can ease the device warpage or detachment of a chip die from the device generated in a comparative via configuration by disposing a more substantially symmetry arrangement of the third and second conductive vias, for example, by disposing them in a substantially symmetry shape (e.g. as shown in FIG. 1) through the first insulation layer 101 or by disposing them at a more substantially symmetry position through the first insulation layer 101 or both.

A number of the second insulation layers 105 may be the same with or different from a number of the third insulation layers 106. In some embodiments, a number of the second insulation layers 105 may be the same with a number of the third insulation layers 106 to further improve the symmetry effect.

One or more fourth connecting element 110a, 110b, 118a, 118b may be disposed adjacent to the third top surface 106a of the third insulation layer 106 of the routing zone 103. In some embodiments, the fourth connecting element 110a, 110b electrically connects to the third conductive via 109a, 109b. The fourth connecting element 110a, 110b may be a bonding bond and/or trace. A bonding pad may be, for example, a contact pad of a trace. The fourth connecting element 110a, 110b may include, for example, one of, or a combination of, copper, gold, indium, tin, silver, palladium, osmium, iridium, ruthenium, titanium, magnesium, aluminum, cobalt, nickel, or zinc, or other metals or metal alloys.

The third insulation layer 106 may include an insulation material or other suitable material that has low dielectric constant and/or low dielectric loss as a base material. In some embodiments, the third insulation layer 106 includes polypropylene.

Figure 2:
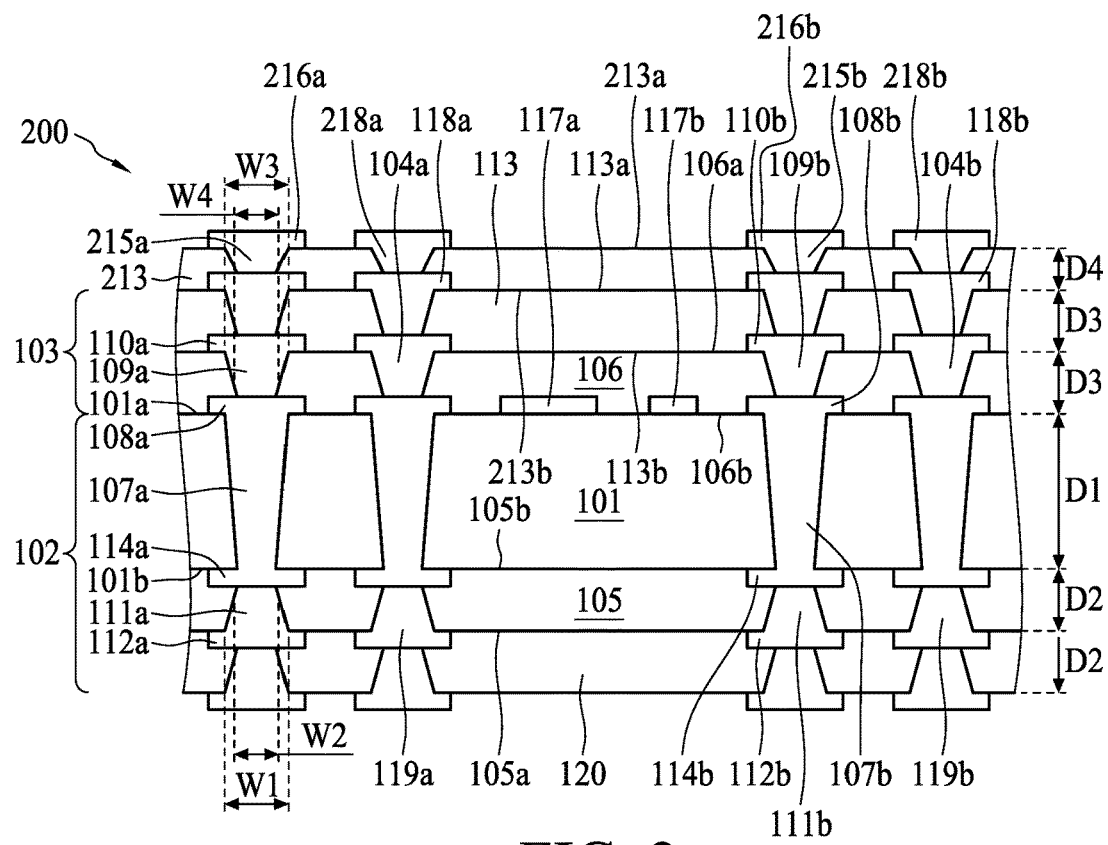
FIG. 2 illustrates a cross-sectional view of a semiconductor device according to an embodiment of the present disclosure.

FIG. 2 illustrates a cross-sectional view of a semiconductor device 200 according to an embodiment of the present disclosure. The semiconductor device 200 is similar to that illustrated in FIG. 1, with a difference being that a fourth insulation layer 213 is disposed adjacent to the routing zone 103. In some embodiments, the fourth insulation layer 213 is disposed adjacent to the third top surface 113a of the third insulation layer 113 and distant from the first insulation layer 101. In some embodiments, the second insulation layer 105 is disposed adjacent to the first insulation layer 101 and distant from the third insulation layer 106. In some embodiments, the second insulation layer 105 is disposed adjacent to the first insulation layer 101 and distant from the fourth insulation layer 213.

The fourth insulation layer 213 has a fourth top surface 213a, a fourth bottom surface 213b opposite to the fourth top surface 213a, and a fourth thickness D4. As shown in the embodiment of FIG. 2, the fourth insulation layer 213 is disposed on the third insulation layer 113.

The thickness D4 of the fourth insulation layer 213 is different from the thickness D3 of the third insulation layer 113. The thickness D4 of the fourth insulation layer 213 may also be different from the thickness D1 of the first insulation layer 101. In some embodiments, the thickness D4 of the fourth insulation layer 213 is smaller than the thickness D3 of the third insulation layer 113. In some embodiments, the thickness D4 of the fourth insulation layer 213 is smaller than the thickness D1 of the first insulation layer 101. In some embodiments, the thickness D4 of the fourth insulation layer 213 is smaller than the thickness D2 of the second insulation layer 105. In some embodiments, the thickness D4 of the fourth insulation layer 213 is smaller than the thickness D1 of the first insulation layer 101 and the thickness D3 of the third insulation layer 106.

By designing the third insulation layer 106, 113 as having a thickness D3 greater than the thickness D4 of the fourth insulation layer 213 (or another insulation layer disposed above the fourth insulation layer 213), the antenna device warpage in a comparative antenna configuration can be eased because a thicker insulation layer can provide more strength to reduce the stress caused by the comparative antenna arrangement of the insulation layers and vias compared to a thinner one. In some embodiments, the thickness D4 of the fourth insulation layer 213 may be in the range of about 30 μm to about 150 μm, about 30 μm to about 145 μm, about 30 μm to about 140 μm, about 30 μm to about 135 μm, about 30 μm to about 130 μm, about 30 μm to about 125 μm, about 30 μm to about 120 μm, about 30 μm to about 115 μm, about 30 μm to about 110 μm, about 30 μm to about 105 μm, or about 30 μm to about 100 μm.

The fourth insulation layer 213 defines one or more opening 218a, 218b. Each opening 218a, 218b corresponds to a respective fourth conductive via 215a, 215b. In some embodiments, the opening 218a, 218b inclines inwardly from the opening to the bottom. Accordingly, the respective fourth conductive via 215a, 215b will also be in a shape inclining inwardly from the opening to the bottom. The opening 218a, 218b is defined by a shape and/or position substantially corresponding to the opening 119a, 119b in the second insulation layer 105 through the first insulation layer 101 so that the fourth conductive via 215a, 215b formed in the opening 218a, 218b can substantially match the second conductive via 111a, 111b in shape and/or position through the first insulation layer 101. The opening 218a, 218b may also be defined by a shape and/or position substantially the same to the opening 104a, 104b in the third insulation layer 106 so that the fourth conductive via 215a, 215b can be substantially the same to the third conductive via 109a, 109b in the third insulation layer 106 in shape and/or position.

One or more fifth connecting element 216a, 216b may be disposed adjacent to the fourth top surface 213a of the fourth insulation layer 213. In some embodiments, the fifth connecting element 216a, 216b electrically connects to the fourth conductive via 215a, 215b. The fifth connecting element 216a, 216b may be a bonding bond and/or trace. A bonding pad may be, for example, a contact pad of a trace. The fifth connecting element 216a, 216b may include, for example, one of, or a combination of, copper, gold, indium, tin, silver, palladium, osmium, iridium, ruthenium, titanium, magnesium, aluminum, cobalt, nickel, or zinc, or other metals or metal alloys.

The fourth insulation layer 213 may be a part of a stack of layers or a part of a routing zone each having substantially the same or different thickness. In some embodiments, the fourth insulation layer 213 is a part of a second routing zone or a part of a second RF routing zone.

Figure 3:
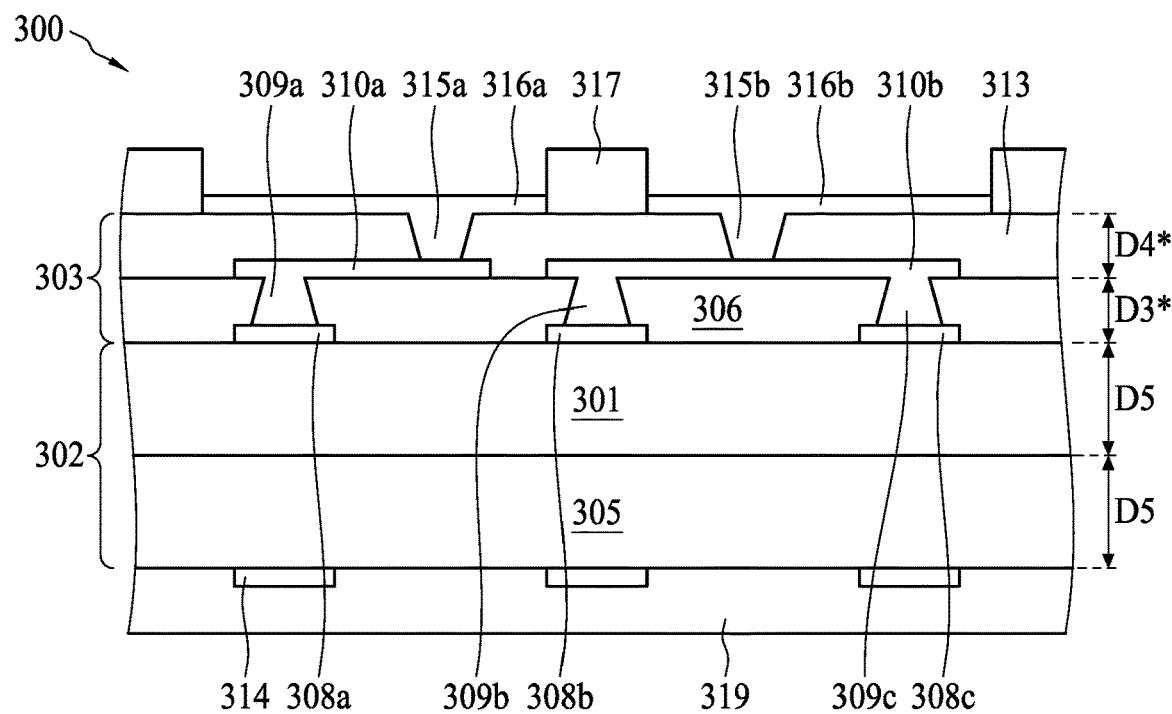
FIG. 3 illustrates a cross-sectional view of a semiconductor device according to an embodiment of the present disclosure.

FIG. 3 illustrates a cross-sectional view of a semiconductor device 300 according to an embodiment of the present disclosure. The semiconductor device 300 of FIG. 3 includes an antenna zone 302, a routing zone 303, a first protection layer 317, and a second protection layer 319.

The antenna zone 302 may be applied to a semiconductor device that may be operated at a high frequency. In some embodiments, the antenna zone 302 may be applied to a semiconductor device that may be operated at a frequency in the range of about 2 GHz to about 300 GHz, about 5 GHz to about 300 GHz, about 10 GHz to about 300 GHz, about 15 GHz to about 300 GHz, about 20 GHz to about 300 GHz, about 25 GHz to about 300 GHz, about 30 GHz to about 300 GHz, about 35 GHz to about 300 GHz, about 40 GHz to about 300 GHz, or about 45 GHz to about 300 GHz.

The antenna zone 302 includes a first insulation layer 301 and a second insulation layer 305. The thickness and material of the first insulation layer 301 and the second insulation layer 305 are determined depending on the desired function or property of the antenna zone 302. For example, if the antenna zone 302 is designed to be operated at a high frequency such as to be operated in the range of 30 GHz to 300 GHz, in order to reduce the transmission loss and to transmit for a long distance, the antenna zone 302 should be thicker and/or include materials with low dielectric constant and dielectric loss. Nevertheless, as the antenna zone 302 becomes thicker, it would become more costly and more difficult to process, such as when disposing a through hole therein or disposing a circuit thereon, which involves highly precise control and costly equipment. Moreover, the miniaturization demand may not be satisfied. The thickness of the first insulation layer 301 and that of the second insulation layer 305 may be substantially the same or different depending on the desired n function of the antenna zone 302.

In some embodiments, the first insulation layer 301 may have a thickness D5 of about 90 μm to about 300 about 100 μm to about 290 about 110 μm to about 280 about 120 μm to about 270 about 130 μm to about 260 about 140 μm to about 250 about 150 μm to about 240 about 160 μm to about 230 μm, 170 μm to about 220 or about 180 μm to about 210 μm.

One or more first connecting element 308a, 308b, 308c may be disposed adjacent to the top surface of the first insulation layer 301 for electrical connection. The first connecting element 308a, 308b, 308c may be a bonding bond and/or trace. A bonding pad may be, for example, a contact pad of a trace. The first connecting element 308a, 308b, 308c may include, for example, one of, or a combination of, copper, gold, indium, tin, silver, palladium, osmium, iridium, ruthenium, titanium, magnesium, aluminum, cobalt, nickel, or zinc, or other metals or metal alloys.

The first insulation layer 301 may include an insulation material or other suitable material that has low dielectric constant and/or low dielectric loss as a base material. In some embodiments, the first insulation layer 301 includes polypropylene.

The second insulation layer 305 is disposed adjacent to the bottom surface of the first insulation layer 301. In some embodiments, the first insulation layer 301 and the second insulation layer 305 in the antenna zone 302 are disposed next to each other. In some embodiments, the first insulation layer 301 and the second insulation layer 305 are stacked together without any layer disposed therebetween. In some embodiments, the first insulation layer 301 and the second insulation layer 305 are stacked together without a metal layer disposed therebetween. The first insulation layer 301 and the second insulation layer 305 may include a conductive via as shown in the embodiment of FIG. 1. Alternatively, the first insulation layer 301 and the second insulation layer 305 may include no conductive via as shown in the embodiment of FIG. 3.

In some embodiments, the thickness D5 of the second insulation layer 305 is substantially the same with the thickness D5 of the first insulation layer 301. The thickness D5 of the second insulation layer 305 and the thickness D5 of the first insulation layer should be considered together and determined depending on the thickness criterion of the antenna zone 302.

One or more second connecting element 314 may be disposed adjacent to the top surface of the second insulation layer 305 for electrical connection. The second connecting element 314 may be a bonding bond and/or trace. A bonding pad may be, for example, a contact pad of a trace. The second connecting element 314 may include, for example, one of, or a combination of, copper, gold, indium, tin, silver, palladium, osmium, iridium, ruthenium, titanium, magnesium, aluminum, cobalt, nickel, or zinc, or other metals or metal alloys.

The second insulation layer 305 may include an insulation material or other suitable material that has low dielectric constant and/or low dielectric loss as a base material. In some embodiments, the second insulation layer 305 includes polypropylene.

The routing zone 303 is disposed on the antenna zone 302. The routing zone 303 includes at least one third insulation layer 306 and at least one fourth insulation layer 313.

The third insulation layer 306 is disposed adjacent to the first insulation layer 301 and distant from the second insulation layer 305. The third insulation layer 306 has a third thickness D3* and includes one or more third conductive via 309a, 309b. 309c.

The thickness D3* of the third insulation layer 306 is different from the thickness D5 of the first insulation layer 301. In some embodiments, the thickness D3* of the third insulation layer 306 is smaller than thickness D5 of the first insulation layer 301. By designing the third insulation layer 306 as having a thickness D3* smaller than the thickness D5 of the first insulation layer 301, the warpage of a semiconductor device caused by a comparative antenna configuration can be eased because a thicker insulation layer is provided and a thicker insulation layer can provide more strength compared to a thinner one.

In some embodiments, the thickness D3* of the third insulation layer 306 may be in the range of about 70 µm to about 200 µm, about 75 µm to about 195 µm, about 80 µm to about 190 µm, about 85 µm to about 185 µm, about 90 µm to about 180 µm, about 95 µm to about 175 µm, about 100 µm to about 170 µm, about 105 µm to about 165 µm, about 110 µm to about 160 µm, of about 115 µm to about 155 µm, about 120 µm to about 145 µm, or about 125 µm to about 140 µm.

The fourth insulation layer 313 is disposed adjacent to the third insulation layer 306. In some embodiments, the fourth insulation layer 313 is disposed adjacent to the top surface of the third insulation layer 306 and distant from the first insulation layer 301. The fourth insulation layer 213 has a fourth thickness D4* and includes one or more second conductive via 315a, 315b.

The thickness D4* of the fourth insulation layer 313 may be substantially the same with or different from the thickness D3* of the third insulation layer 306. The thickness D4* of the fourth insulation layer 313 may also be different from the thickness D5 of the first insulation layer 301. In some embodiments, the thickness D4* of the fourth insulation layer 313 is smaller than the thickness D3* of the third insulation layer 306. In some embodiments, the thickness D4* of the fourth insulation layer 313 is substantially the same with the thickness D3* of the third insulation layer 306.

In some embodiments, the thickness D4 of the fourth insulation layer 213 may be in the range of about 30 µm to about 150 about 30 µm to about 145 about 30 µm to about 140 about 30 µm to about 135 about 30 µm to about 130 about 30 µm to about 125 about 30 µm to about 120 about 30 µm to about 115 about 30 µm to about 110 about 30 µm to about 105 or about 30 µm to about 100 µm.

The first conductive via 309a, 309b, 309c in the third insulation layer 306 may be formed by a shape having a direction different from the second conducive via 315a, 315b in the fourth insulation layer 313. In some embodiments, the first conducive via 309a, 309b, 309c is formed by a shape inclining inwardly from the bottom to the opening and the second conductive via 315a, 315b is formed by a shape inclining inwardly from the opening to the bottom. In some embodiments, the first conducive via 309a, 309b, 309c matches the second conductive via 315a, 315b in shape through the interface between the third insulation layer 306 and the fourth insulation layer 313. In some embodiments, the first conductive via 309a, 309b, 309c and the second conducive via 315a, 315b are formed at an alternative position. In some embodiments, the first conductive via 309a, 309b, 309c electrically connect to the first connecting element 308a, 308b, 308c disposed adjacent to the surface of the first insulation layer 301 and the routing zone 303 may electrically connect to the antenna zone 302 through the first conductive via 309a, 309b, 309c connected to the first connecting element 308a, 308b, 308c. In some embodiments, the routing zone 303 may have electrical connection through the fourth connecting element 316a, 316b disposed adjacent to the surface of the fourth insulation layer 313. In some embodiments, the second conductive via 315a, 315b electrically connects to the third connecting element 310a, 310b and the fourth connecting element 316a, 316b.

The first protection layer 317 is disposed adjacent to the top surface of the fourth insulation layer 313. In some embodiments, the first protection layer 317 covers portions of the top surface of the fourth insulation layer 313. The first protection layer 317 may define at least one opening exposing at least a portion of the fourth connecting element 316a, 316b for external electrical connection, such as connection to a copper pillar, solder or stud bump. Alternatively, the first protection layer 317 may cover the fourth connecting element 316a, 316b entirely. The first protection layer 317 may be, for example, a solder mask (the material of which is, for example, PI) or a passivation layer (the material of which, for example, is a metal oxide).

The second protection layer 319 is disposed adjacent to the top surface of the second insulation layer 305. In some embodiments, the second protection layer 319 covers portions of the top surface of the second insulation layer 305. The second protection layer 319 may cover the second connecting element 314 entirely. Alternatively, the second protection layer 319 may define at least one opening exposing at least a portion of the second connecting element 314 for external electrical connection, such as connection to a copper pillar, solder or stud bump. The second protection layer 319 may be, for example, a solder mask (the material of which is, for example, PI) or a passivation layer (the material of which, for example, is a metal oxide).

Figure 4:
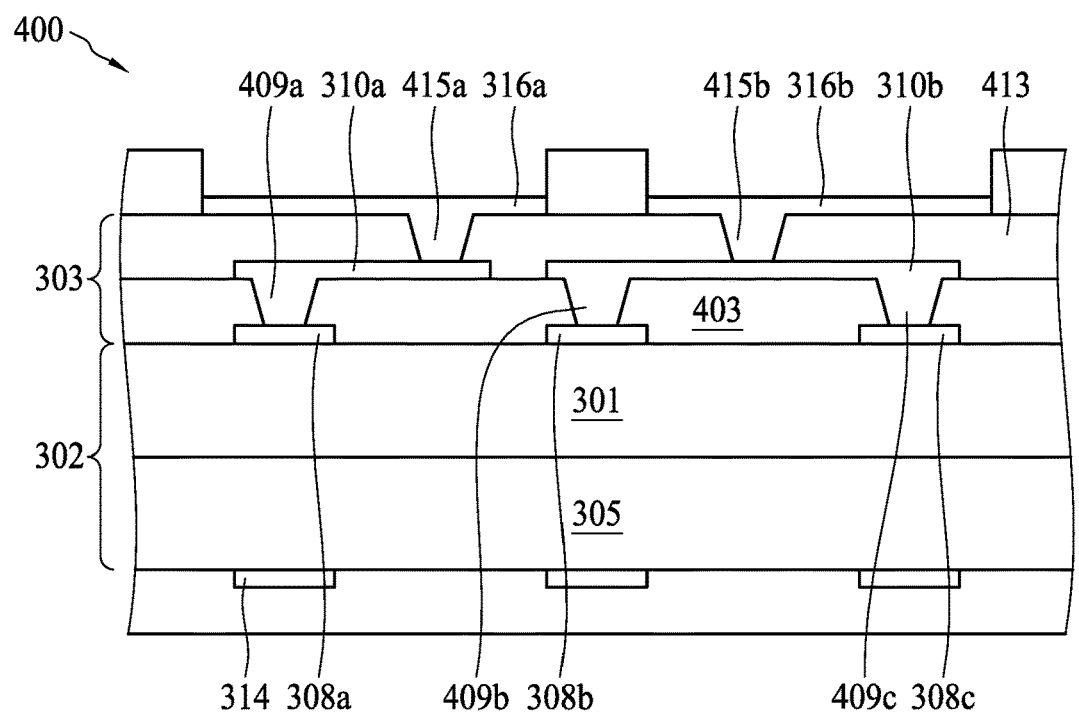
FIG. 4 illustrates a cross-sectional view of a semiconductor device according to an embodiment of the present disclosure.

FIG. 4 illustrates a cross-sectional view of a semiconductor device 400 according to an embodiment of the present disclosure. The semiconductor device 400 is similar to that illustrated in FIG. 3, with a difference being that the first conductive via 409a, 409b, 409c in the third insulation layer 403 may be formed by a shape inclining in a direction substantially the same with the second conducive via 415a, 415b in the fourth insulation layer 413. In some embodiments, the first conducive via 409a, 409b, 409c is formed by a shape inclining inwardly from the opening to the bottom and the second conductive via 415a, 415b is also formed by a shape inclining inwardly from the opening to the bottom.

Figure 5:
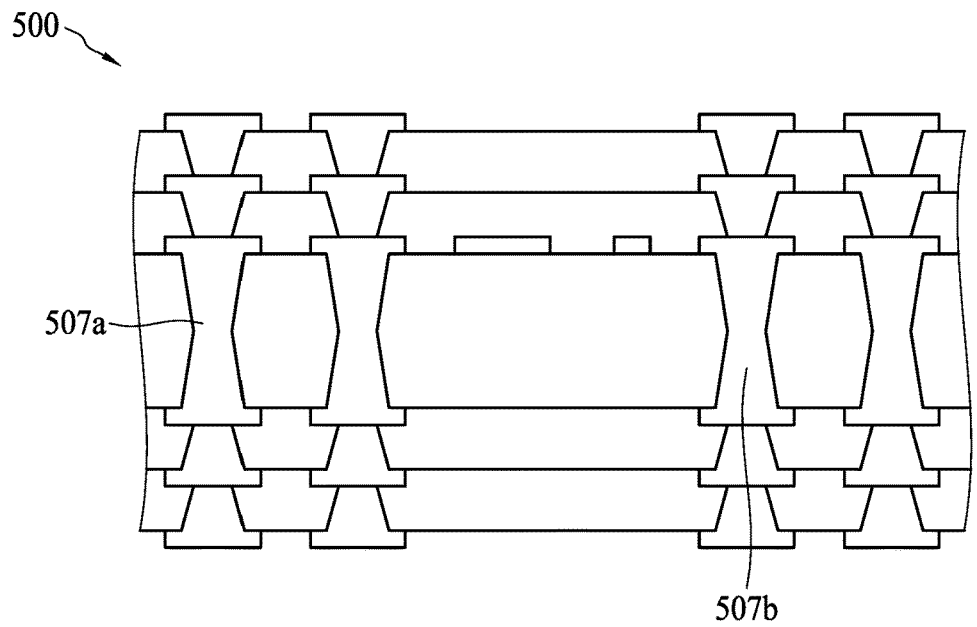
FIG. 5 illustrates a cross-sectional view of a semiconductor device according to an embodiment of the present disclosure.

FIG. 5 illustrates a cross-sectional view of a semiconductor device 500 according to an embodiment of the present disclosure. The semiconductor device 500 is similar to that illustrated in FIG. 1, with a difference being that the first conductive via 507a, 507b is formed by a X or X-like shape so that the device warpage caused by the stress of the trace layers in a comparative antenna structure (due to the high via density in the trace layers) disposed above can be further eased, because a X or X-like shape via in an antenna zone can provide more strength and acts in a way similar to a rivet. In some embodiments, the first conductive via 507a, 507b in an X or X-like shape can be formed by laser drilling.

Figure 6:
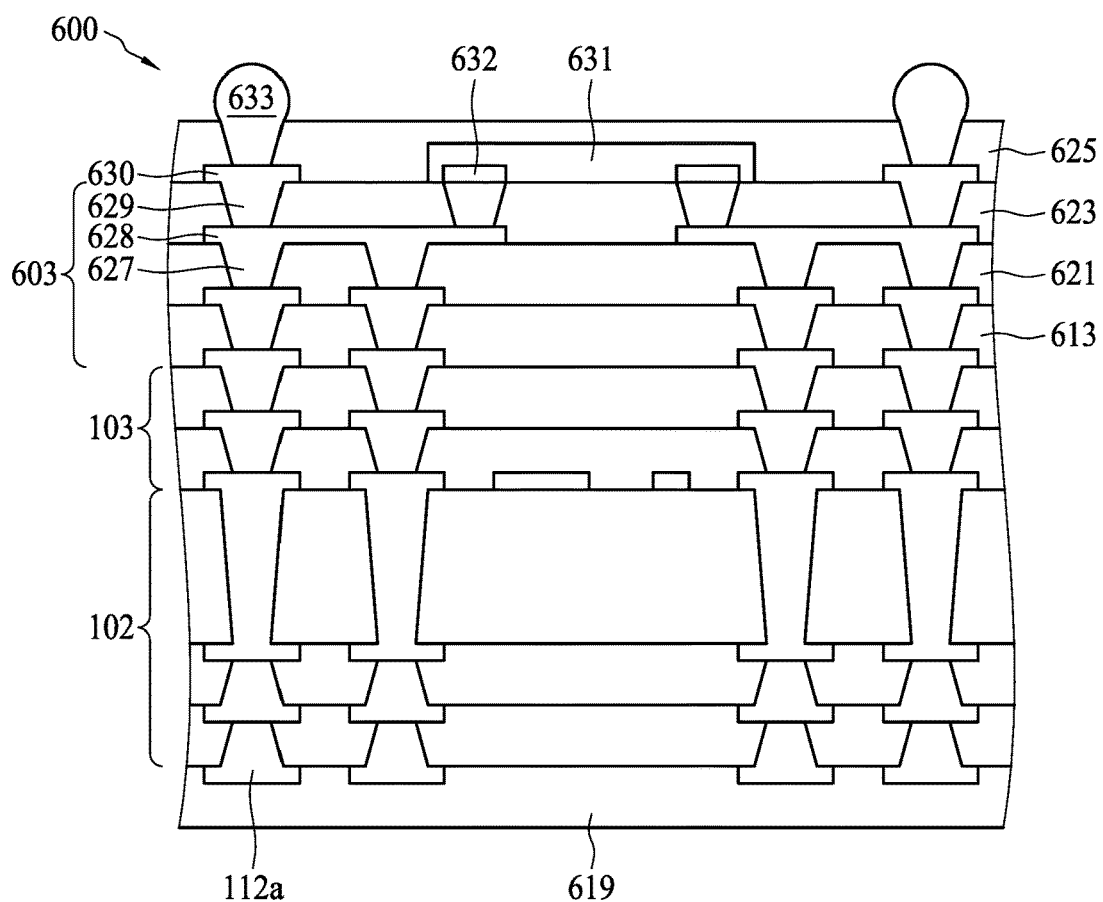
FIG. 6 illustrates a cross-sectional view of a semiconductor device according to an embodiment of the present disclosure.

FIG. 6 illustrates a cross-sectional view of a semiconductor device 600 according to an embodiment of the present disclosure. The semiconductor device 600 is similar to that illustrated in FIG. 2, with a difference being that a second routing zone 603, a semiconductor component 631, a first protection layer 625, and a second protection layer 619 are provided.

The second routing zone 603 is disposed adjacent to the first routing zone 103. In some embodiments, the second routing zone 603 is disposed adjacent to the top surface of the first routing zone 103. The second routing zone 603 may include one or more fourth insulation layer, 613, 621, 623 having a thickness substantially the same with the thickness D4 described above. In some embodiments, the second routing zone 603 includes three fourth insulation layers 613, 621, 623. The fourth insulation layers 613, 621, 623 may include one or more conductive via 627, 629, and one or more connecting element 628, 630 may be disposed on the surface of the fourth insulation layers 613, 621, 623 for electrical connection between the layers or to external environment.

The semiconductor component 631 is disposed adjacent to the top surface of the second routing zone 603. The semiconductor component 631 may be any semiconductor component including, for example, a chip, a package, an interposer, or a combination thereof. In the embodiment illustrated in FIG. 6, the semiconductor component 631 includes at least one bonding pad 632.

The bonding pad 632 is disposed adjacent to the surface of the semiconductor component 631. The bonding pad 632 may be, for example, a contact pad of a trace. The bonding pad 632 may include, for example, copper, gold, indium, tin, silver, palladium, osmium, iridium, ruthenium, titanium, magnesium, aluminum, cobalt, nickel, or zinc, other metals, metal alloys, or a combination of two or more thereof.

The first protection layer 625 is disposed adjacent to the top surface of the second routing zone 603. In some embodiments, the first protection layer 625 covers portions of the top surface of the fourth insulation layer 623 and encapsulates the semiconductor component 631. The first protection layer 625 may define at least one opening exposing at least a portion of the connecting element 630 for external electrical connection, such as connection to a copper pillar, solder or stud bump. Alternatively, the first protection layer 625 may cover the connecting element 630 entirely. In the embodiment illustrated in FIG. 6, the first protection layer 625 defines at least one opening exposing at least a portion of the connecting element 630 for electrical connection to a solder. The first protection layer 625 may be, for example, a solder mask (the material of which is, for example, PI) or a passivation layer (the material of which, for example, is a metal oxide).

The second protection layer 619 is disposed adjacent to the top surface of the antenna zone 102. In some embodiments, the second protection layer 619 covers portions of the top surface of the antenna zone 102. The second protection layer 619 may cover the third connecting element 112a entirely. Alternatively, the second protection layer 619 may define at least one opening exposing at least a portion of the third connecting element 112a for external electrical connection, such as connection to a copper pillar, solder or stud bump. The second protection layer 619 may be, for example, a solder mask (the material of which is, for example, PI) or a passivation layer (the material of which, for example, is a metal oxide).

Figure 7A:
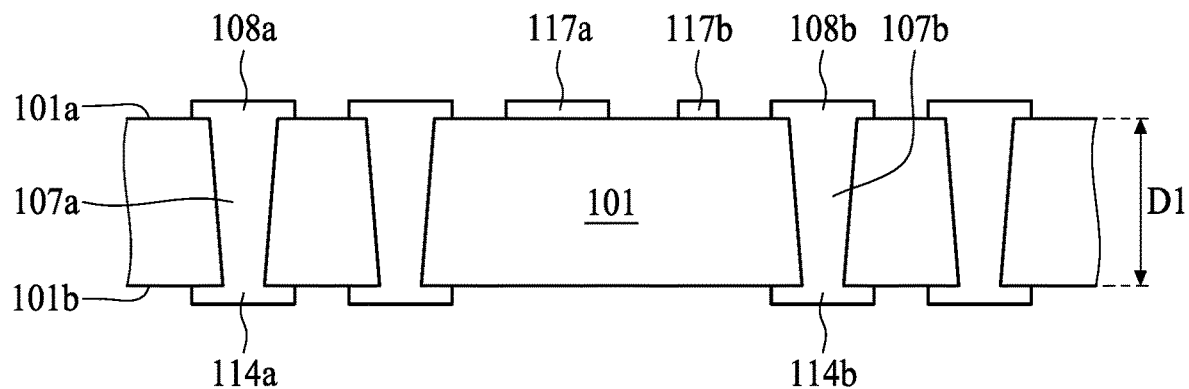
FIG. 7A, FIG. 7B, and FIG. 7C illustrate a method for manufacturing a semiconductor device such as the semiconductor device of FIG. 1.
Figure 7B:
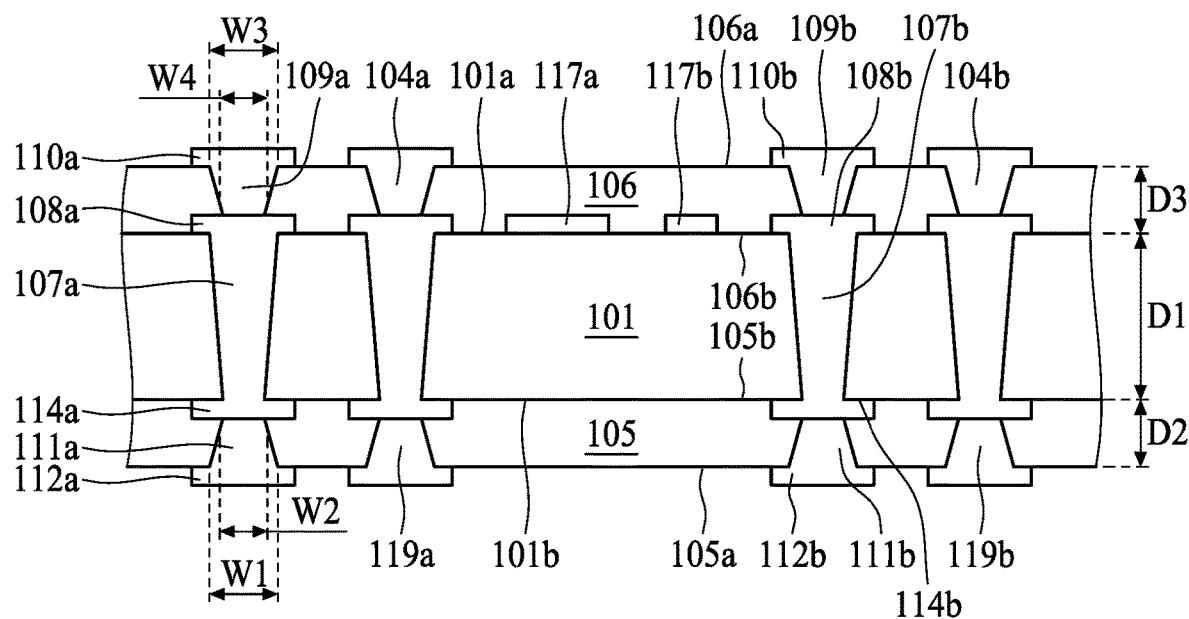
Figure 7C:
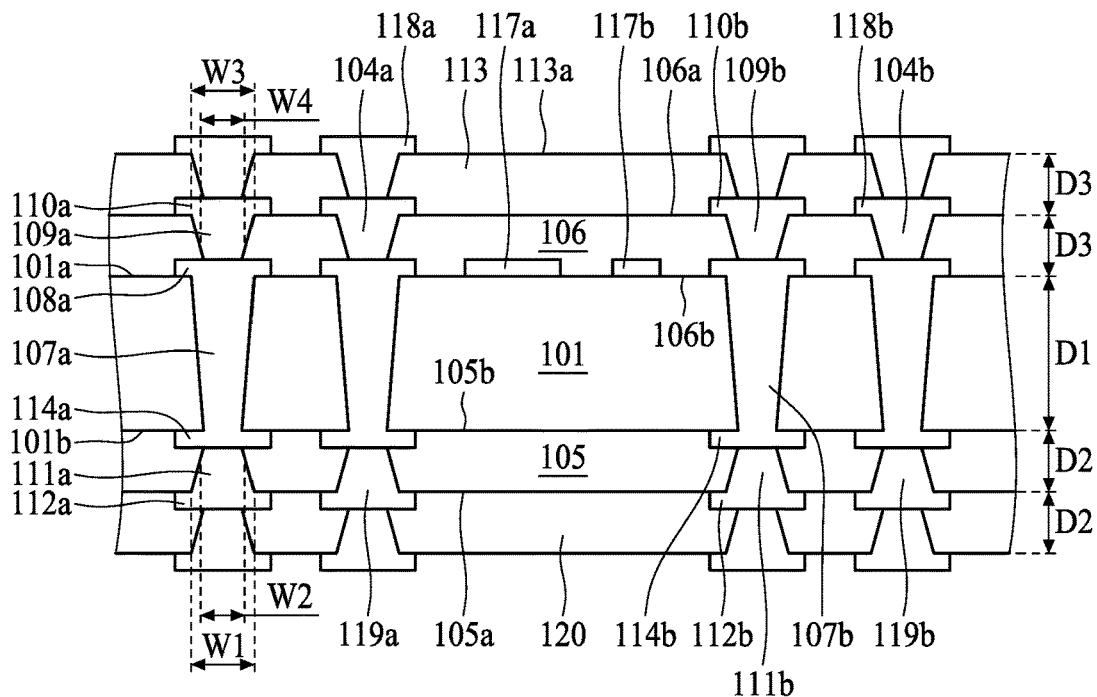

FIGS. 7A-7C illustrate a method for manufacturing a semiconductor device such as the semiconductor device 100 of FIG. 1. FIGS. 7A-7D illustrate a method for manufacturing a semiconductor device such as the semiconductor device 200 of FIG. 2.

Referring to FIG. 7A, a first antenna layer 101 with a thickness D1 is provided. The first antenna layer 101 has a first surface 101a and a second surface 101b opposite to the first surface 101a. In addition, the first antenna layer 101 includes one or more antenna conductive via 107a, 107b. One or more first antenna connecting element 108a, 108b may be provided on the first surface 101a, and one or more second antenna connecting element 114a, 114b may be provided on the second surface 101b of the first antenna layer 101. One or more bonding bond and/or trace and one or more overlying interconnection structures therein 117a, 117b may be provided on the surface of the first antenna layer 101. The compartment or antenna conductive via 107a, 107b may be formed by mechanical drilling or laser drilling (or etching) and electroplating. In some embodiments, the antenna conductive via 107a, 107b is a through hole formed by mechanical drilling. In some embodiments, the antenna conductive via 107a, 107b is in an X or X-like shape formed by laser drilling.

Referring to FIG. 7B, a second antenna layer 105 is disposed adjacent to the second surface 101b of the first antenna layer 101 with a thickness D2. The thickness D1 of the first insulation layer 101 is different from the thickness D2 of the second insulation layer 105. In some embodiments, the thickness D1 of the first insulation layer 101 is greater than the thickness D2 of the second insulation layer 105. The second antenna layer 105 has or defines one or more openings 119a, 119b having a first width W1 close to the opening and a second width W2 close to the bottom to expose the second antenna connecting element 114a, 114b. Each opening 119a, 119b corresponds to a respective second conductive via 111a, 111b. The opening 119a, 119b has a first width W1 greater than a second width W2. Accordingly, the respective second conductive via 111a, 111b will also have a first width W1 greater than a second width W2.

The third connecting element 112a, 112b is disposed adjacent to the second top surface 105a of the second antenna layer 105. In some embodiments, the third connecting element 112a, 112b electrically connects to the second conductive via 111a, 111b and may be a bonding bond and/or trace. In some embodiments, the opening 119a, 119b can be formed by, e.g., routing, etching, or other suitable processes. The second conductive via 111a, 111b may be formed by electroplating. In some embodiments, the second conductive via 111a, 111b may be formed by a shape inclining in a direction different from the antenna conducive via 107a, 107b by forming the opening 119a, 119b and the opening in the antenna layer with opposite direction. The second conductive via 111a, 111b may be formed by electroplating.

A first insulation layer 106 is disposed adjacent to the first surface 101a of the first antenna layer 101 with a thickness D3 and opposite to the second antenna layer 105. The first insulation layer 106 has or defines one or more openings 104a, 104b having a third width W3 close to the opening and a fourth width W4 close to the bottom to expose the first antenna connecting element 108a, 108b. Each opening 104a, 104b corresponds to a respective third conductive via 109a, 109b. The opening 104a, 104b is defined by a shape and/or position substantially matching the opening 119a, 119b in the second antenna layer 105 through the first antenna layer 101. The opening 104a, 104b has a third width W3 greater than a fourth width W4. Accordingly, the respective third conductive via 109a, 109b will also have a third width W3 greater than a fourth width W4. The fourth connecting element 110a, 110b is disposed adjacent to the first top surface 106a of the first insulation layer 106. In some embodiments, the fourth connecting element 110a, 110b electrically connects to the third conductive via 109a, 109b and may be a bonding bond and/or trace. In some embodiments, the opening 104a, 104b can be formed by, e.g., routing, etching, or other suitable processes. The third conductive via 109a, 109b may be formed by electroplating.

The first insulation layer 106 and the second antenna layer 105 may be disposed in the same process or by different processes. In some embodiments, the first insulation layer 106 and the second antenna layer 105 are disposed in the same process.

Referring to FIG. 7C, a third antenna layer 120 is disposed adjacent to the second top surface 105a of the second antenna layer 105 with a thickness D2. The elements and processes of forming the third antenna layer 120 are similar to those of the second antenna layer 105.

A second insulation layer 113 is disposed adjacent to the first top surface 106a of the first insulation layer 106 with a thickness D3 and opposite to the third antenna layer 120. The thickness D3 of the third insulation layer 106 is different from the thickness D1 of the first insulation layer 101. In some embodiments, the thickness D3 of the third insulation layer 106 is smaller than thickness D1 of the first insulation layer 101. The elements and processes of forming the second insulation layer 113 are similar to those of the first insulation layer 106. In some embodiments, the third antenna layer 120 and the second insulation layer 113 are disposed in the same process.

Figure 7D:
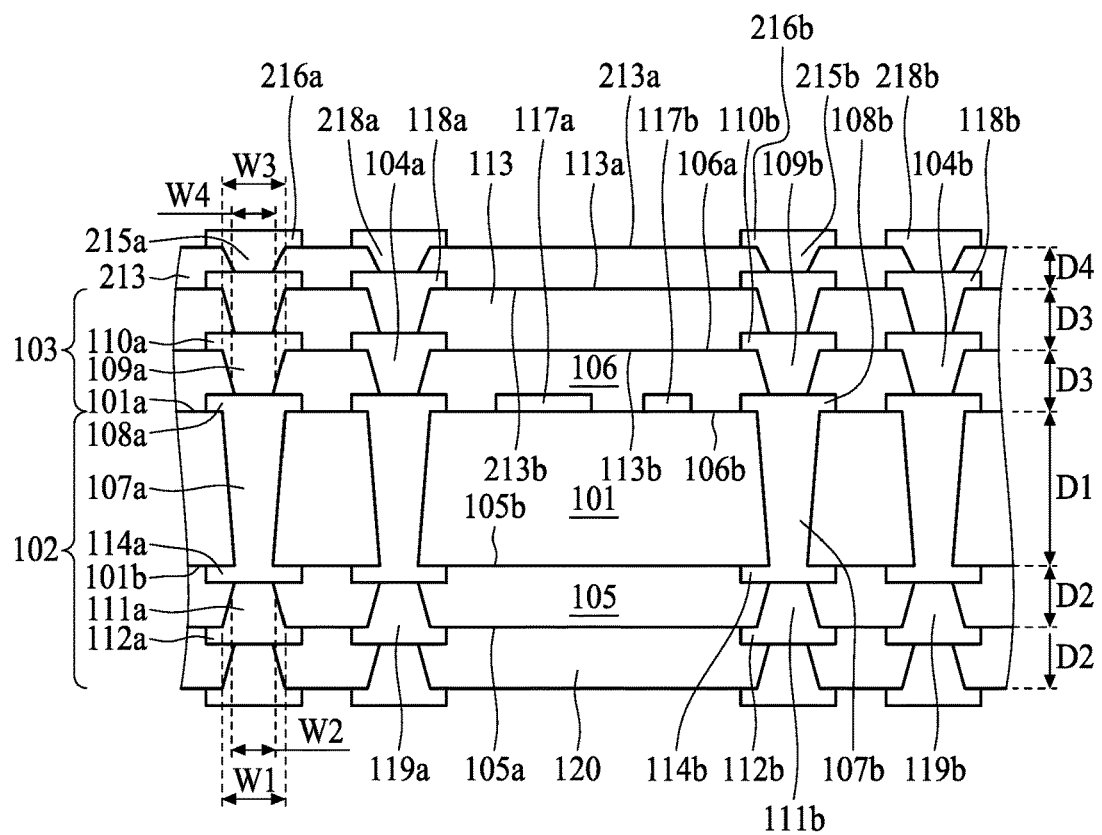

Referring to FIG. 7D, a third insulation layer 213 is disposed adjacent to the second top surface 113a of the second insulation layer 113 with a thickness D4. The thickness D4 of the third insulation layer 213 is different from the thickness D3 of the second insulation layer 113. In some embodiments, the thickness D4 of the third insulation layer 213 is smaller than the thickness D3 of the second insulation layer 113. The third insulation layer 213 defines one or more opening 218a, 218b. Each opening 218a, 218b corresponds to a respective fourth conductive via 215a, 215b, respectively. The opening 218a, 218b is defined by a shape and/or position substantially corresponding to the opening 119a, 119b in the second antenna layer 105 through the first antenna layer 101 so that the fourth conductive via 215a, 215b formed in the opening 218a, 218b can substantially match the second conductive via 111a, 111b in shape and/or position through the first antenna layer 101. The elements and processes of forming the third insulation layer 213 are similar to those of the second insulation layer 113.

The fifth connecting element 216a, 216b is disposed adjacent to the fourth top surface 213a of the third insulation layer 213. In some embodiments, the fifth connecting element 216a, 216b electrically connects to the fourth conductive via 215a, 215b. The fifth connecting element 216a, 216b may be formed, for example, by photolithography in combination with etching and electroplating or physical vapor deposition.

Figure 8A:
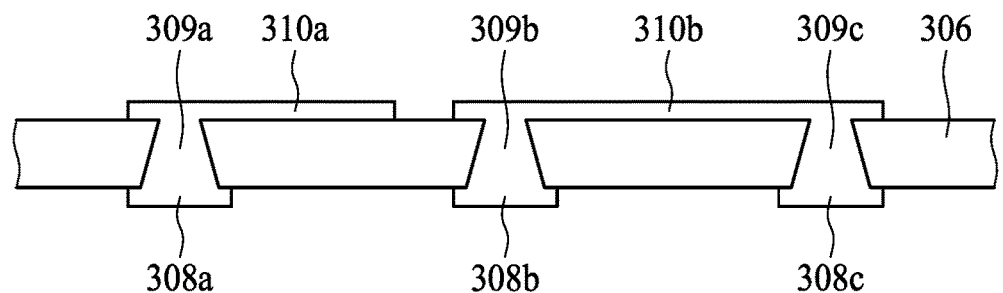
FIG. 8A, FIG. 8B, and FIG. 8C illustrate a method for manufacturing a semiconductor device such as the semiconductor device of FIG. 3.
Figure 8B:
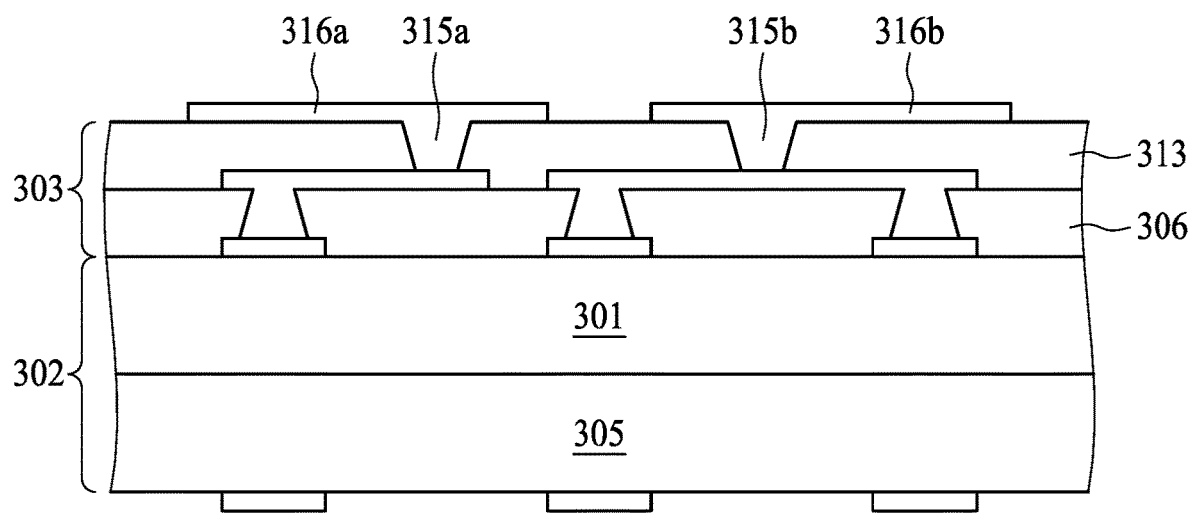
Figure 8C:
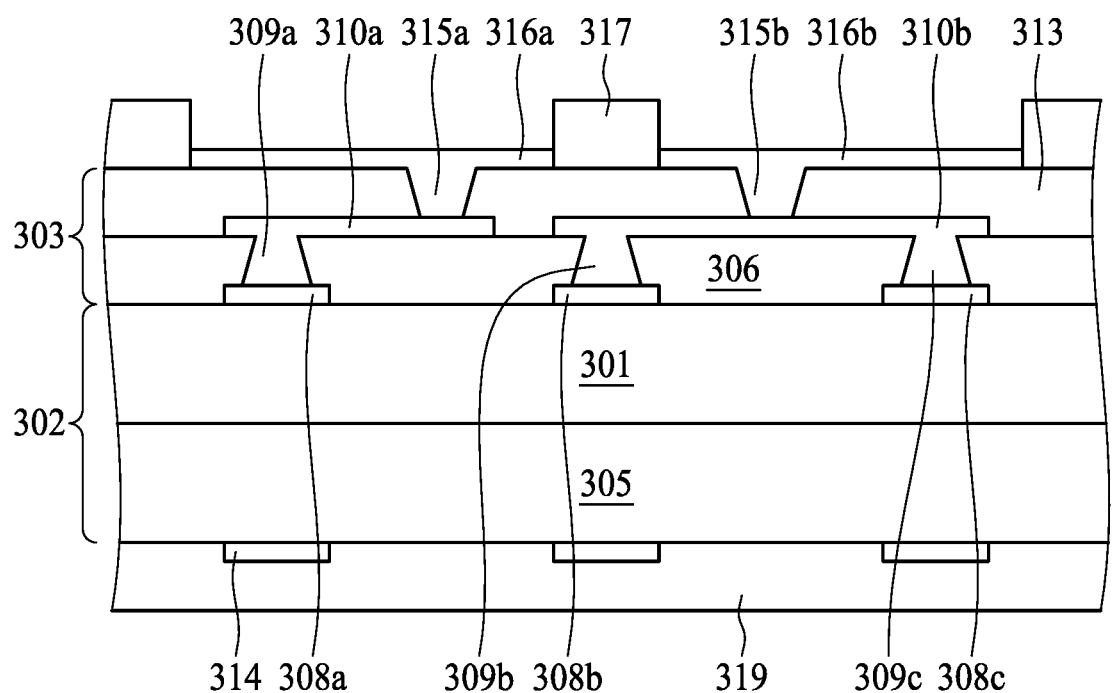

FIGS. 8A-8C illustrate a method for manufacturing a semiconductor device such as the semiconductor device 300 of FIG. 3.

Referring to FIG. 8A, a third insulation layer 306 is provided. The third insulation layer 306 has a third thickness D3* and one or more third conductive via 309a, 309b, 309c. In addition, one or more first connecting element 308a, 308b, 308c and one or more third connecting element 310a, 310b may be provided on the surfaces of the third insulation layer 306. In some embodiments, the first conductive via 309a, 309b, 309c electrically connects to the first connecting element 308a, 308b, 308c. The first conductive via 309a, 309b, 309c may be formed, for example, by laser drilling in combination with electroplating or physical vapor deposition. The first connecting element 308a, 308b, 308c and third connecting element 310a, 310b may be formed, for example, by photolithography in combination with etching and electroplating or physical vapor deposition.

Referring to FIG. 8B, a fourth insulation layer 313 is disposed adjacent to the third insulation layer 306. In some embodiments, the third insulation layer 306 and the fourth insulation layer 313 may constitute a first routing zone 303. The fourth insulation layer 313 has a fourth thickness D4* and one or more second conductive via 315a, 315b. In addition, one or more fourth connecting element 316a, 316b may be provided on the surface of the fourth insulation layer 313. In some embodiments, the second conductive via 315a, 315b electrically connects to the third connecting element 310a, 310b. The second conductive via 315a, 315b may be formed, for example, by laser drilling in combination with electroplating or physical vapor deposition. The fourth connecting element 316a, 316b may be formed, for example, by photolithography in combination with etching and electroplating or physical vapor deposition.

In addition, the first routing zone 303 is disposed adjacent to a surface of an antenna zone 302. The antenna zone 302 may include two or more insulation layers 301, 305 with substantially the same thickness. One or more second connecting element 314 may be provided on the surface of the antenna zone 302 for electrical connection. The second connecting element 314 may be formed, for example, by photolithography in combination with etching and electroplating or physical vapor deposition.

Referring to FIG. 8C, a first protection layer 317 is disposed adjacent to the top surface of the first routing zone 303. In the embodiment illustrated in FIG. 8C, the first protection layer 317 covers portions of the top surface of the fourth insulation layer 313 and defines at least one opening exposing at least a portion of the fourth connecting element 316a, 316b for external electrical connection, such as connection to a copper pillar, solder or stud bump.

The second protection layer 319 is disposed adjacent to the top surface of the antenna zone 302. In the embodiment illustrated in FIG. 8C, the second protection layer 319 covers portions of the top surface of the antenna zone 302 and covers the second connecting element 314 entirely.

FIGS. 9A-9E illustrate a method for manufacturing a semiconductor device such as the semiconductor device 400 of FIG. 4.

Figure 9A:
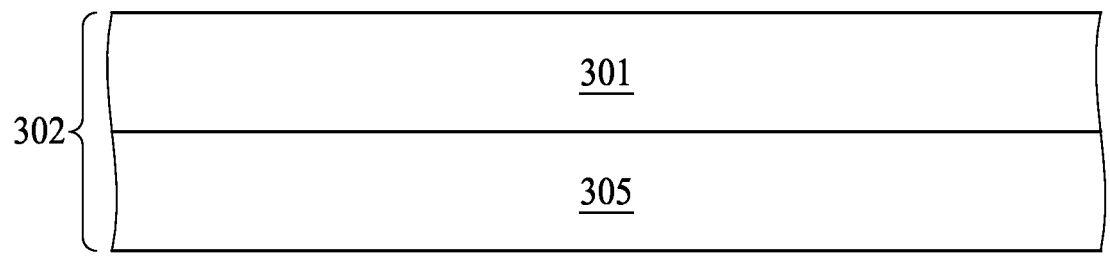
FIG. 9A, FIG. 9B, FIG. 9C, FIG. 9D, and FIG. 9E illustrate a method for manufacturing a semiconductor device such as the semiconductor device of FIG. 4.

Referring to FIG. 9A, an antenna zone 302 is provided. The antenna zone 302 includes a first insulation layer 301 and a second insulation layer 305 with a thickness D5.

Figure 9B:
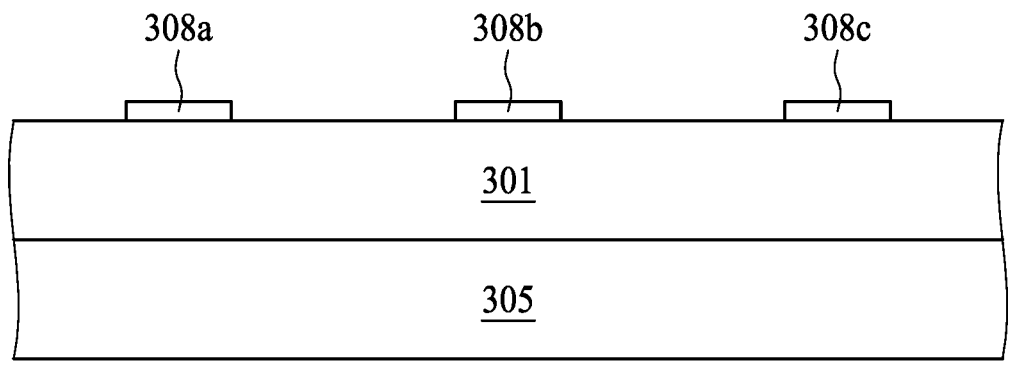

Referring to FIG. 9B, one or more first connecting element 308a, 308b, 308c is disposed adjacent to a surface of the antenna zone 302. The first connecting element 308a, 308b, 308c may be formed, for example, by photolithography in combination with etching and electroplating or physical vapor deposition.

Figure 9C:
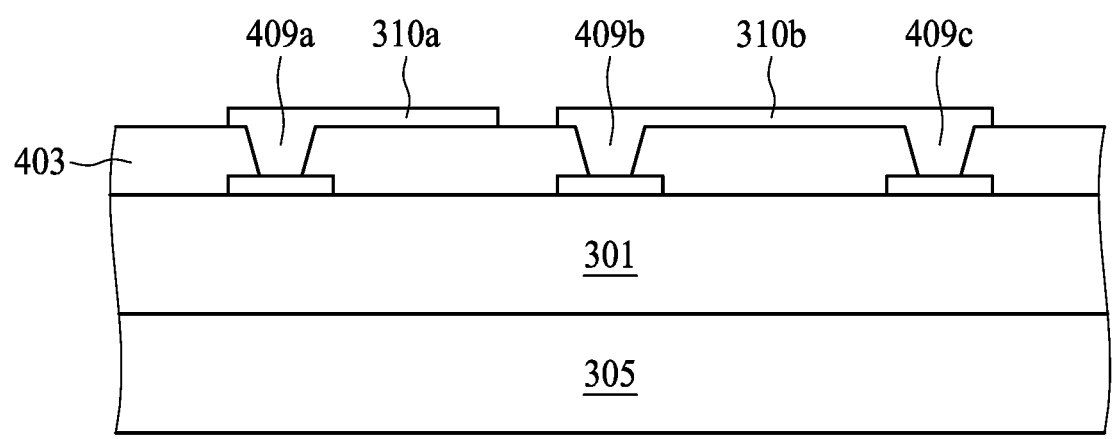

Referring to FIG. 9C, a third insulation layer 403 is disposed adjacent to the top surface of the antenna zone 302. The third insulation layer 403 has a third thickness D3* and one or more first conductive via 409a, 409b, 409c. One or more third connecting element 310a, 310b may be provided on the surface of the third insulation layer 403. In some embodiments, the first conductive via 409a, 409b, 409c electrically connects to the third connecting element 310a, 310b and first connecting element 308a, 308b, 308c. The first conductive via 409a, 409b, 409c may be formed, for example, by laser drilling in combination with electroplating or physical vapor deposition. The third connecting element 310a, 310b may be formed, for example, by photolithography in combination with etching and electroplating or physical vapor deposition.

Figure 9D:
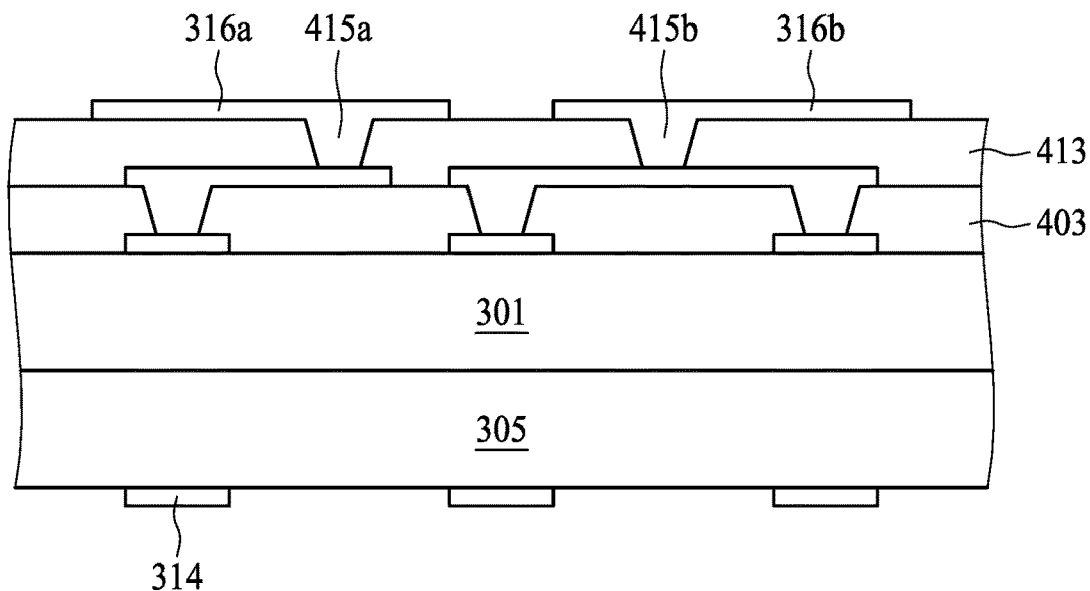

Referring to FIG. 9D, a fourth insulation layer 413 is disposed adjacent to the top surface of the third insulation layer 403. The fourth insulation layer 413 has a fourth thickness D4* and one or more second conductive via 415a, 415b. One or more fourth connecting element 316a, 316b may be provided on the surface of the fourth insulation layer 413. In some embodiments, the second conductive via 415a, 415b electrically connects to the third connecting element 310a, 310b and fourth connecting element 316a, 316b. The second conductive via 415a, 415b may be formed, for example, by laser drilling in combination with electroplating or physical vapor deposition. The fourth connecting element 316a, 316b may be formed, for example, by photolithography in combination with etching and electroplating or physical vapor deposition.

Figure 9E:
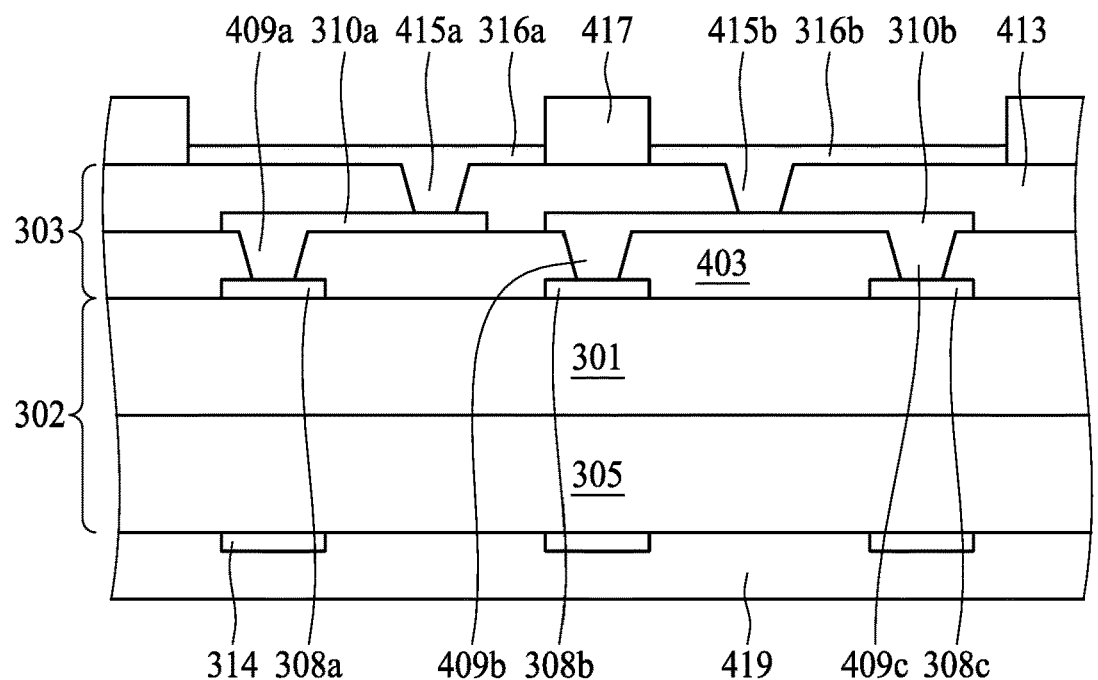

Referring to FIG. 9E, a first protection layer 417 is disposed adjacent to the top surface of the first routing zone 303. In the embodiments illustrated in FIG. 9E, the first protection layer 417 covers portions of the top surface of the fourth insulation layer 413 and defines at least one opening exposing at least a portion of the fourth connecting element 316a, 316b for external electrical connection, such as connection to a copper pillar, solder or stud bump.

In addition, a second protection layer 419 is disposed adjacent to the top surface of the antenna zone 302. In the embodiments illustrated in FIG. 9E, the second protection layer 419 covers portions of the top surface of the antenna zone 302 and covers the second connecting element 314 entirely.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 µm, no greater than 1 µm, or no greater than 0.5 µm.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device, comprising:
   an antenna zone; and
   a routing zone disposed on the antenna zone,
   wherein the antenna zone comprises a first insulation layer and a plurality of second insulation layers, a thickness of the first insulation layer is different from that of the second insulation layer, and the first insulation layer direct contacts the second insulation layer, and wherein the routing zone includes a plurality of third insulation layers disposed adjacent to the first insulation layer and opposite to the second insulation layer and a fourth insulation layer disposed adjacent to the third insulation layer, a thickness of the third insulation layer is smaller than that of the first insulation layer, and a thickness of the fourth insulation layer is different from the third insulation layer.

2. The semiconductor device of claim 1, wherein the first insulation layer is closer to the routing zone than the second insulation layer and the thickness of the first insulation layer is greater than that of the second insulation layer.

3. The semiconductor device of claim 2, wherein the first insulation layers and the second insulation layers are stacked in an alternative manner.

4. The semiconductor device of claim 1, wherein the thickness of the third insulation layer is substantially equal to that of the second insulation layer.

5. The semiconductor device of claim 1, wherein the third insulation layer is closer to the first insulation layer than the fourth insulation layer and the thickness of the fourth insulation layer is smaller than that of the third insulation layer.

6. The semiconductor device of claim 5, wherein the thickness of the fourth insulation layer is smaller than that of the second insulation layer.

7. The semiconductor device of claim 1, wherein a number of the second insulation layers is substantially equal to a number of the third insulation layers.

8. The semiconductor device of claim 1, wherein the plurality of the third insulation layers direct contact the first insulation layer and opposite to the second insulation layer.

9. The semiconductor device of claim 1, wherein the second insulation layer comprises one or more of a second conductive via, the third insulation layer comprises one or more of a third conductive via, and the third conductive via substantially matches the second conductive via in shape through the first insulation layer.

10. The semiconductor device of claim 9, wherein the fourth insulation layer comprises one or more of a fourth conductive via and a shape of the fourth conductive via is substantially the same with the shape of the third conductive via.

11. The semiconductor device of claim 10, wherein the first insulation layer comprises one or more of a first conductive via, wherein a shape of the first conductive via is different from the second conductive via and the third conductive via.

12. A semiconductor device, comprising:
an antenna zone comprising an antenna layer;
an RF routing zone disposed on the antenna zone, wherein the RF routing zone includes one or more of a first insulation layer and a second insulation layer and a thickness of the first insulation layer is different from that of the second insulation layer;
a semiconductor component disposed adjacent to the RF routing zone and opposite to the antenna zone;
a first protection layer disposed adjacent to the RF routing zone, encapsulating the semiconductor component, and exposing at least one electrical connector; and
a second protection layer covering the antenna zone.

13. The semiconductor device of claim 12, wherein the antenna zone includes a third insulation layer disposed adjacent the first insulation layer and distant from the second insulation layer and one or more of a fourth insulation layer disposed adjacent the third insulation layer and distant from the first insulation layer.

14. The semiconductor device of claim 13, wherein a thickness of the third insulation layer is greater than that of the first insulation layer.

15. The semiconductor device of claim 14, wherein the thickness of the first insulation layer is greater than that of the second insulation layer.

16. The semiconductor device of claim 15, wherein the thickness of the first insulation layer is substantially equal to the thickness of the fourth insulation layer.

17. The semiconductor device of claim 13, wherein a number of the first insulation layers is substantially equal to a number of the fourth insulation layers.

18. The semiconductor device of claim 12, wherein the first insulation layer comprises one or more of a first conductive via, the second insulation layer comprises one or more of a second conductive via, and the first conductive via substantially matches the second conductive via in shape through the interface between the first insulation layer and the second insulation layer.

19. The semiconductor device of claim 12, wherein the first insulation layer comprises one or more of a first conductive via, the second insulation layer comprises one or more of a second conductive via, and the first conductive via is formed by a shape inclining in a direction substantially the same with the second conductive via.

20. A semiconductor device, comprising:
an antenna zone, comprising
a first insulation layer; and
a plurality of second insulation layers directly contacting the first insulation layer, wherein a thickness of the second insulation layer is smaller than that of the first insulation layer; and
a routing zone disposed on the antenna zone, comprising
a plurality of third insulation layers directly contacting the first insulation layer and opposite to the second insulation layer, wherein a thickness of the third insulation layer is different from that of the first insulation layer and a number of the second insulation layers is substantially equal to a number of the third insulation layers; and
a fourth insulation layer directly contacting the third insulation layer, wherein a thickness of the fourth insulation layer is smaller than that of the third insulation layer.

* * * * *